United States Patent
Niiyama et al.

(10) Patent No.: US 10,600,666 B2
(45) Date of Patent: Mar. 24, 2020

(54) ARTICLE TRANSPORT FACILITY

(71) Applicant: Daifuku Co., Ltd., Osaka-shi (JP)

(72) Inventors: Takashi Niiyama, Hinocho (JP); Takahiro Horii, Hinocho (JP)

(73) Assignee: Daifuku Co., Ltd., Osaka-shi (JP)

(*) Notice: Subject to any disclaimer, the term of this patent is extended or adjusted under 35 U.S.C. 154(b) by 228 days.

(21) Appl. No.: 15/792,925

(22) Filed: Oct. 25, 2017

(65) Prior Publication Data
US 2018/0122671 A1 May 3, 2018

(30) Foreign Application Priority Data
Oct. 28, 2016 (JP) ................................ 2016-212135

(51) Int. Cl.
| | | |
|---|---|---|
| H01L 21/677 | (2006.01) | |
| B61B 3/02 | (2006.01) | |
| B65G 43/10 | (2006.01) | |
| B61J 1/06 | (2006.01) | |
| B65G 47/61 | (2006.01) | |

(52) U.S. Cl.
CPC .......... *H01L 21/67715* (2013.01); *B61B 3/02* (2013.01); *B65G 43/10* (2013.01); *H01L 21/6773* (2013.01); *H01L 21/67727* (2013.01); *H01L 21/67733* (2013.01); *H01L 21/67736* (2013.01); *H01L 21/67775* (2013.01); *B61J 1/06* (2013.01); *B65G 47/61* (2013.01); *B65G 2201/0297* (2013.01)

(58) Field of Classification Search
CPC ......... H01L 21/67715; H01L 21/67727; H01L 21/67733; H01L 21/67736; B65G 43/10; B61J 1/06

USPC ................................ 104/88.01–88.04, 89, 91
See application file for complete search history.

(56) References Cited

U.S. PATENT DOCUMENTS

| | | | | |
|---|---|---|---|---|
| 5,540,319 A | * | 7/1996 | Orisaka | B61B 13/127 198/465.3 |
| 5,794,534 A | * | 8/1998 | Enderlein | B07C 3/08 104/89 |
| 6,591,961 B2 | * | 7/2003 | Fukushima | B61B 13/00 198/346.1 |
| 6,629,502 B2 | * | 10/2003 | Matsukawa | B61B 13/00 104/130.01 |

(Continued)

FOREIGN PATENT DOCUMENTS

| | | |
|---|---|---|
| JP | 200296725 A | 4/2002 |
| JP | 2006319154 A | 11/2006 |
| JP | 2010228673 A | 10/2010 |

*Primary Examiner* — Jason C Smith
(74) *Attorney, Agent, or Firm* — The Webb Law Firm

(57) ABSTRACT

An article transport facility includes a transport device which has a connecting portion connected to the storage device, and which is configured to transport an article. The connecting portion is located on the first side with respect to the first path whereas a subject path is located on the second side with respect to the first path. The transporting path of an article by the transport device is so located to cross the first path in plan view and to extend at least from the connecting portion and to the second side with respect to the first path. A first transfer portion to or from which an article is transferred by a transport vehicle traveling along the subject path is set in a portion of the transporting path that is located on the second side with respect to the first path.

8 Claims, 7 Drawing Sheets

(56) References Cited

U.S. PATENT DOCUMENTS

| | | | | |
|---|---|---|---|---|
| 6,655,297 B2* | 12/2003 | Kawato | ............ | B61J 1/06 |
| | | | | 104/96 |
| 8,322,287 B2* | 12/2012 | Oguro | ............ | B65G 37/02 |
| | | | | 104/88.01 |
| 8,448,579 B2* | 5/2013 | Inui | ............ | B60L 5/005 |
| | | | | 104/288 |
| 8,826,825 B2* | 9/2014 | Shibata | ............ | B61B 3/02 |
| | | | | 104/288 |
| 8,862,397 B2* | 10/2014 | Tsujimoto | ............ | G08G 1/164 |
| | | | | 701/517 |
| 9,045,147 B2* | 6/2015 | Kasuya | ............ | B61B 1/005 |
| 9,758,177 B2* | 9/2017 | Takada | ............ | B61B 3/02 |
| 9,895,977 B2* | 2/2018 | Wada | ............ | B60L 5/005 |
| 10,181,873 B2* | 1/2019 | Allen | ............ | H04B 3/54 |
| 10,196,214 B2* | 2/2019 | Motoori | ............ | B65G 17/20 |
| 2005/0005808 A1* | 1/2005 | Wakabayashi | ............ | H01L 21/67276 |
| | | | | 104/88.01 |
| 2009/0000505 A1* | 1/2009 | Shimamura | ............ | B61B 13/00 |
| | | | | 104/88.02 |
| 2010/0242784 A1* | 9/2010 | Oguro | ............ | H01L 21/67715 |
| | | | | 104/130.01 |
| 2018/0122671 A1* | 5/2018 | Niiyama | ............ | H01L 21/67775 |

* cited by examiner

ARTICLE TRANSPORT FACILITY

CROSS-REFERENCE TO RELATED APPLICATION

This application claims priority to Japanese Patent Application No. 2016-212135 filed Oct. 28, 2016, the disclosure of which is hereby incorporated in its entirety by reference.

FIELD OF THE INVENTION

The present invention relates to an article transport facility that comprises article transport vehicles each of which is capable of traveling along any of travel paths to transport an article, and a storage device configured to store one or more articles.

BACKGROUND

An example of known article transport facilities, such as one described above, is described in JP Publication of Application No. 2010-228673 (Patent Document 1). Specifically, in the article transport facility described in Patent Document 1, the travel paths (5) for transport vehicles (3) include a primary path (20) which extends by way of storage sections (24) for storing articles, and a plurality of secondary paths (21) that are connected to the primary paths (20) at different locations of the primary paths (20). And each of the plurality of secondary paths (21) is installed to extend by way of article processors (1) for processing articles. And each transport vehicle (3) is configured to transport articles between a plurality of article processors (1) by performing "branching travel" from a primary path (20) to a secondary path (21), and a "merging travel" from a secondary path (21) to a primary path (20).

SUMMARY OF THE INVENTION

Incidentally, in an article transport facility such as one described in Patent Document 1, an article is usually carried into a storage device such as a storage section (24) after an operation is performed on it (or on its contents) by a processing device such as an article processor (1). And the article is temporarily stored in the storage device until it is taken out for transporting to another processing device (for example, processing device that performs the next operation). Thus, to improve article processing efficiency of the processing devices, it is desirable to reduce as much as possible the amount of time required to transport an article between a storage device and a processing device. In addition, to improve article transporting efficiency of the entire facility, it is desirable to avoid a situation in which a transport vehicle that transports an article between a storage device and a processing device interrupts traveling of other transport vehicles.

However, with the arrangement described in Patent Document 1, a transport vehicle (3) must travel along a primary path (20), a connecting path (branching path), and a secondary path (21) in that order when transporting an article from a storage section (24) to an article processor (1). And a transport vehicle (3) must travel along a secondary path (21), a connecting path (merging path), and a primary path (20) in that order when transporting an article from an article processor (1) to a storage section (2). Thus, depending on the layout of the travel paths (5), a transport vehicle (3) may have to travel a large distance when transporting an article between a storage section (24) and an article processor (1) and its smooth traveling may be interrupted by the presence of another transport vehicle (3), for example, when merging into another path, which may increase the amount of time required to transport an article between a storage section (24) and an article processor (1). In addition, when transporting an article between a storage section (24) and an article processor (1), a transport vehicle (3) needs to travel through a plurality of paths in a certain order. This tends to increase the number of transport vehicles (3) whose smooth traveling is interrupted directly or indirectly by the presence of the transport vehicle (3) in question. Thus, the article transporting efficiency in the entire facility may be reduced by a corresponding amount.

Thus, an article transport facility is desired in which any reduction in the article transporting efficiency of the entire facility is reduced while reducing the amount of time required to transport an article between a storage device and a processing device.

An article transport facility of the present disclosure comprises: article transport vehicles each of which is capable of traveling along any of travel paths to transport an article; and a storage device configured to store one or more articles wherein the travel paths include a first path that extends by way of the storage device, and a plurality of second paths connected to the first path at mutually different locations along the first path; wherein each of the plurality of second paths is arranged to extend by way of at least one processing device configured to process an article or one or more contents thereof, wherein the article transport facility includes a transport device which has a connecting portion connected to the storage device, and which is configured to transport an article to be carried into, or being carried out from, the storage device, wherein, with a first side being one side, with respect to the first path, along a lateral width direction of the first path and a second side being the other side, with respect to the first path, along a lateral width direction of the first path, the connecting portion is located on the first side with respect to the first path whereas a subject path which is one of the plurality of second paths is located on the second side with respect to the first path, wherein a transporting path of an article by the transport device is so located to cross the first path in plan view and to extend at least from the connecting portion and to the second side with respect to the first path, and wherein a first transfer portion to or from which an article is transferred by a transport vehicle traveling along the subject path is set in a portion of the transporting path that is located on the second side with respect to the first path.

With the arrangement described above, when transporting an article between a storage device and a processing device by way of which a subject path extends (referred to hereinafter in this section simply as a "processing device"), the article can be transported by a transport device from at least the connecting portion connected to the storage device and the first transfer portion or vice versa; thus, transporting of the article by a transport vehicle can be limited to transporting within the subject path. Therefore, it becomes possible to reduce the transporting distance of an article between a storage device and a processing device can be reduced and to ensure smooth traveling of the transport vehicle that transports the article. As a result, the amount of time required to transport an article between a storage device and a processing device can be reduced. In addition, since the transporting of an article by the transport vehicle for transporting the article between a storage device and a processing device is limited to transporting within a subject path, the number of other transport vehicles whose smooth traveling is interrupted by the presence of such a transport vehicle may be reduced, which in turn reduces any reduction in the article transporting efficiency of the entire facility.

As such, with the arrangement described above, an article transport facility can be provided in which any reduction in the article transporting efficiency of the entire facility is reduced while reducing the amount of time required to transport an article between a storage device and a processing device.

DETAILED DESCRIPTION OF EMBODIMENTS

Embodiments of an article transport facility are described with reference to the attached drawings next.

Figure 1:
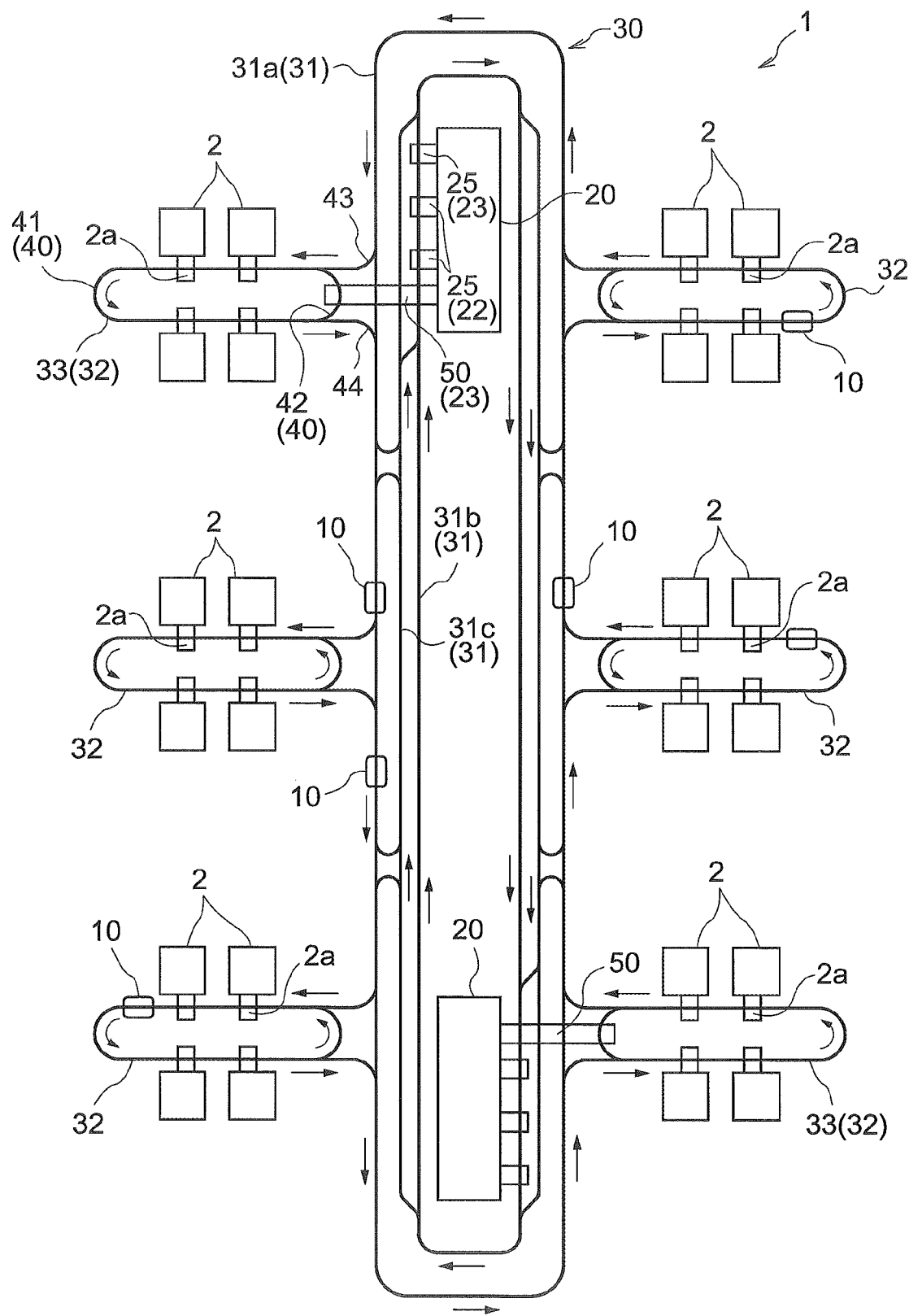
FIG. 1 is a plan view of an article transport facility in accordance with an embodiment.
Figure 2:
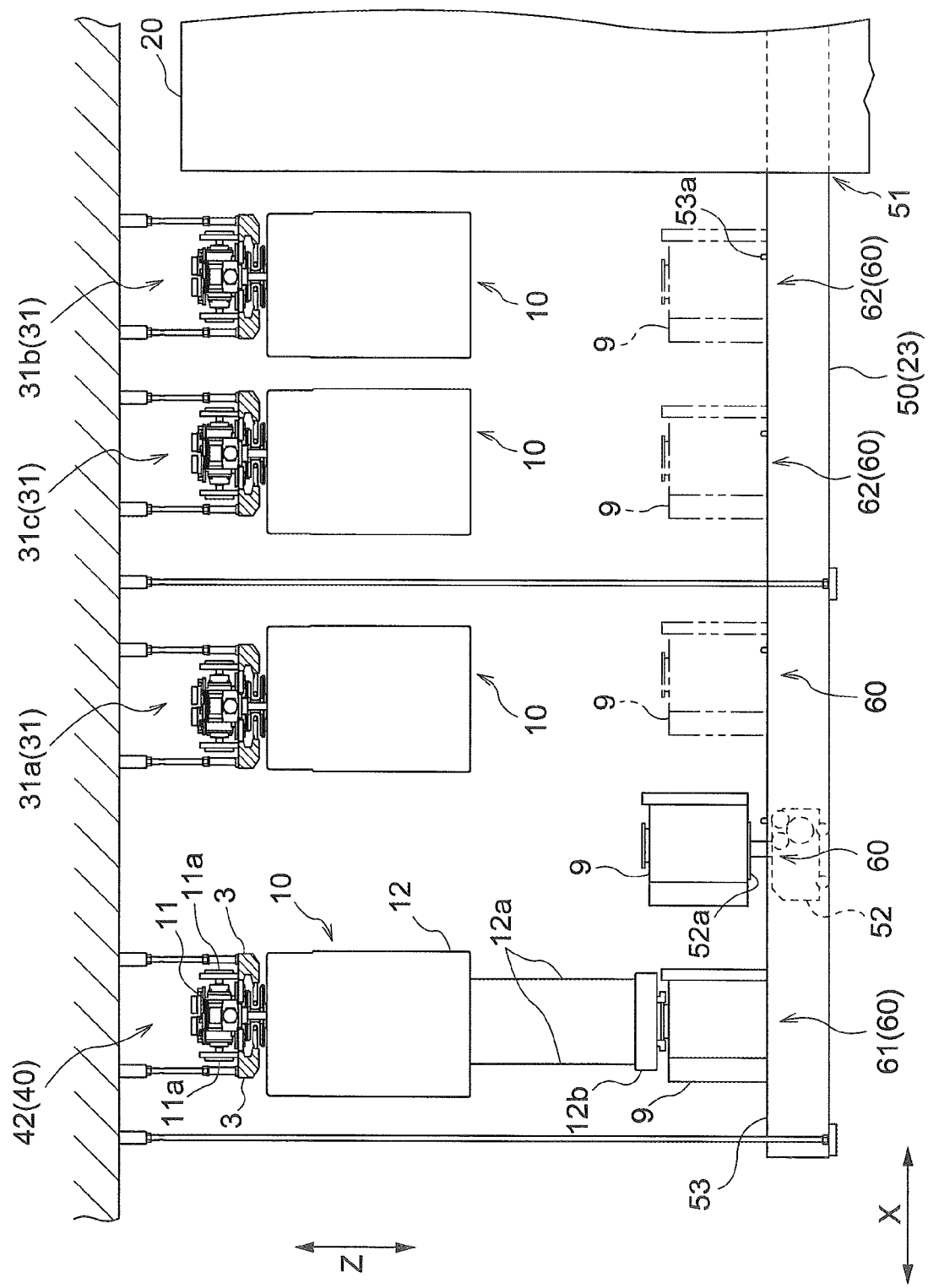
FIG. 2 is a side view of a transport device in accordance with the embodiment.
Figure 4:
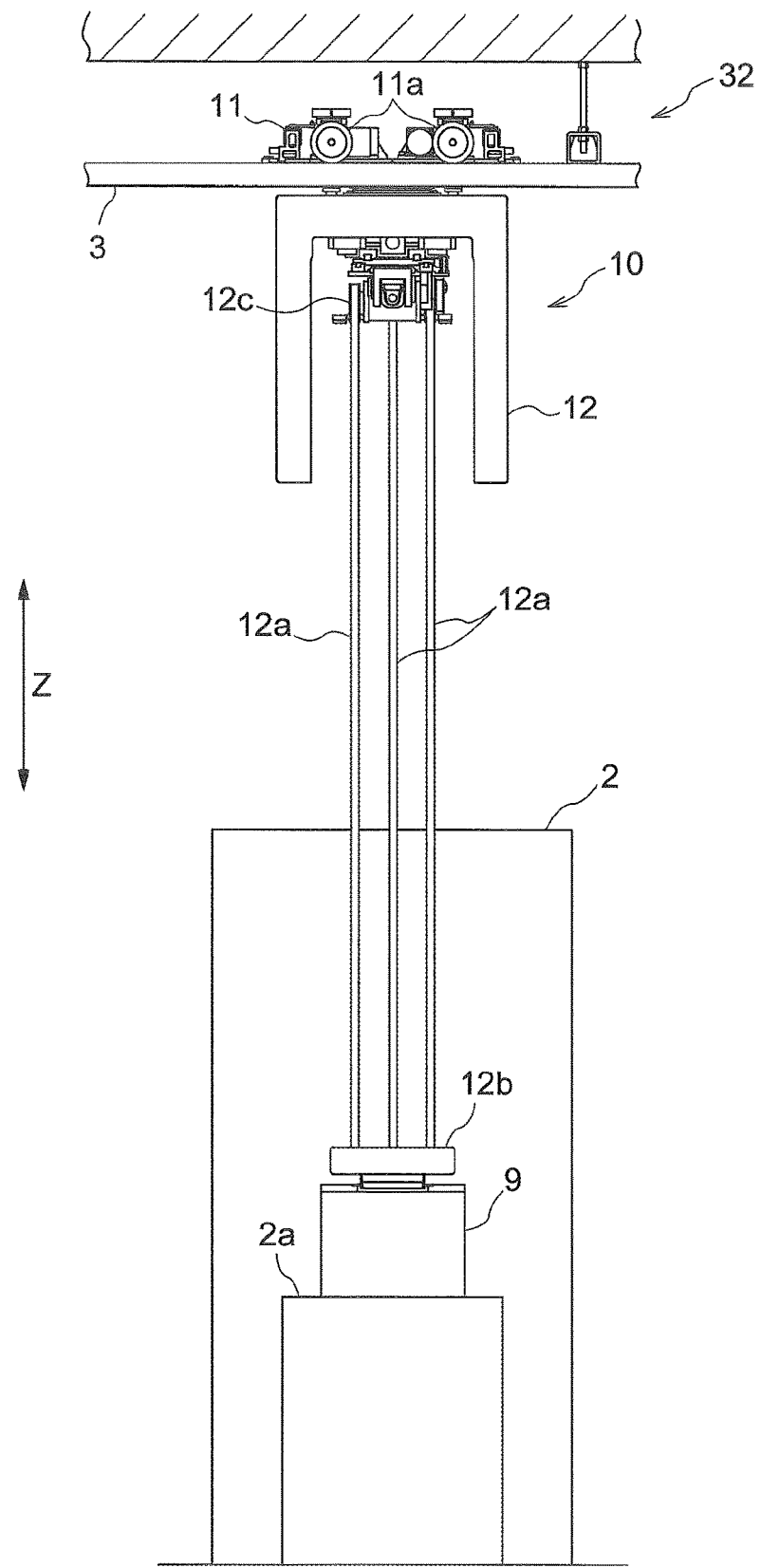
FIG. 4 is a side view of a transport vehicle in accordance with the embodiment.

As shown in FIG. 1, an article transport facility 1 includes transport vehicles 10 each of which is capable of traveling along any of travel paths 30 to transport articles 9 one article 9 at a time (see, for example, FIG. 2), and storage devices 20 each of which is configured to store articles 9. In the present embodiment, rails 3 (see FIGS. 2 and 4) are installed along each travel path 30. And each transport vehicle 10 is configured to be guided by the rails 3 to travel along a travel path 30. That is, each travel path 30 for the transport vehicles 10 is formed by the rails 3. In the present embodiment, the rails 3 are provided above a floor surface, and, more specifically, are fixed to a ceiling with the rails 3 being suspended from and supported by the ceiling as shown in FIGS. 2 and 4. That is, in the present embodiment, each transport vehicle 10 is a ceiling or an overhead transport vehicle configured to travel along the rails 3 provided on the ceiling side. Note that, in the present embodiment, a pair of rails 3 are provided along each travel path 30. And each transport vehicle 10 is guided by the pair of rails 3 to travel along a travel path 30. As shown in FIG. 1, the article transport facility 1 includes a plurality of transport vehicles 10 in the present embodiment. And the plurality of transport vehicles 10 are all controlled to travel each part of the travel paths 30 in the same direction (directions indicated by the arrows in FIG. 1). That is, in the present embodiment, each travel path 30 is a one-way path.

While not shown, a plurality of storage sections each of which is configured to store an article 9 are provided within each storage device 20. And articles 9 are stored in storage devices 20 with each article stored in a storage section. The plurality of storage sections are arranged one above another in the vertical direction Z and one next to another in a horizontal direction, for example. And each storage device 20 includes storage transport devices 21 (see FIG. 7) configured to transport articles 9. The storage transport devices 21 transport articles between storage sections within the storage device 20 and article transfer locations to and from which transport vehicles 10 transfer (i.e., carry in (or deliver) and take out (receive)) articles 9. That is, an article 9 to be stored in a storage device 20 is carried to an article transfer location by a transport vehicle 10 and is subsequently transported from the article transfer location to a storage section by storage transport devices 21. In addition, an article 9 to be retrieved from a storage device 20 is transported from a storage section to an article transfer location by storage transport devices 21, and is subsequently taken out or picked up from the article transfer location by a transport vehicle 10.

Figure 7:
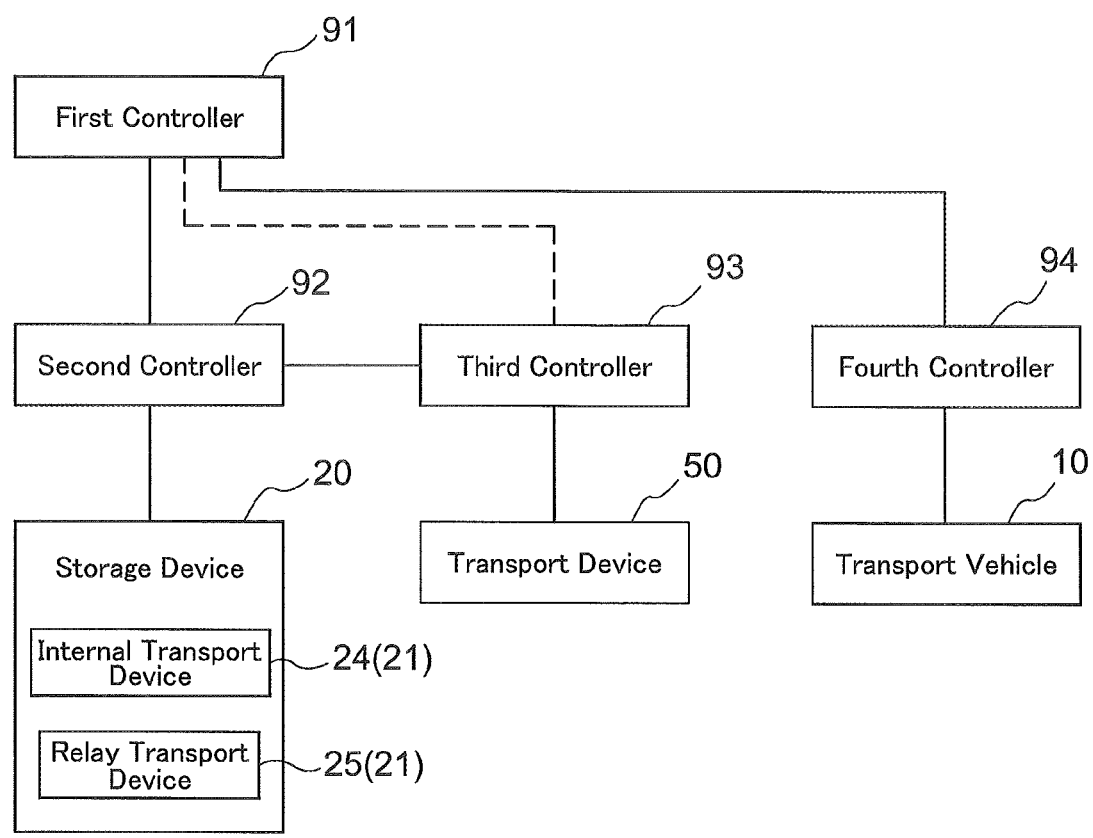
FIG. 7 is a control block diagram in accordance with the embodiment.

As shown in FIG. 7, in the present embodiment, for each storage device 20, the storage transport devices 21 include an internal transport device 24 and relay transport devices 25. In the present embodiment, an article transfer location mentioned above is provided outside a storage device 20. And each relay transport device 25 transports an article 9 between this article transfer location and a relaying location located inside the storage device 20. The internal transport device 24 is a device configured to transport articles 9 one article 9 at a time within the storage device 20, and to transport articles 9 one article 9 at a time between a relaying location mentioned above and any of the storage sections. For example, a stacker crane may be used as the internal transport device 24. Each storage device 20 has walls which cover the periphery of a storage space in which the plurality of storage sections are located. The expression, "inside a storage device 20", means inside of the walls (within the storage space) whereas the expression, "outside a storage device 20", means the outside the walls (outside the storage space). Each relay transport device 25 is provided to extend through a wall of the storage device 20. The portion of each relay transport device 25 that is located outside the storage device 20 functions as an article transfer location whereas the portion of each relay transport device 25 that is located inside the storage device 20 functions as an relaying location.

As shown in FIG. 1, each storage device 20 has a plurality of relay transport devices 25 in the present embodiment. One or more relay transport devices 25 are used as carrying-in portions 22 whereas the remaining relay transport device(s) 25 is/are used as carrying-out portion(s) 23. A carrying-in portion 22 is a location to which an article 9 to be stored in a storage device 20 is carried by a transport vehicle 10 whereas a carrying-out portion 23 is a location from which an article 9 to be retrieved form a storage device 20 is carried out or picked up by a transport vehicle 10. That is, a transport vehicle 10 carries in an article 9 to be stored in a storage device 20 to the article transfer location of a relay transport device 25 used as a carrying-in portion 22, and carries out or picks up an article 9 to be retrieved from the storage device 20 from the article transfer location of a relay transport device 25 used as a carrying-out portion 23.

In the present embodiment, each transport vehicle 10 is a ceiling or overhead transport vehicle which travels along the rails 3 provided on the ceiling side as described above. More specifically, as shown in FIG. 4, each transport vehicle 10 includes a travel portion 11 which has wheels 11a which roll on the rails 3 and which is configured to travel along the rails 3, and a main body portion 12 which is suspended from, and supported by, the travel portion 11 and which is located below the rails 3. The main body portion 12 includes a vertically movable member 12b which can support an article 9, and a vertically moving mechanism 12c configured to vertically move the vertically movable member 12b. The vertically moving mechanism 12c is configured to vertically move the vertically movable member 12b with respect to the travel portion 11 by rotating, in a forward direction and reverse direction, winding members (around each of which an elongate flexible member 12a which suspends and supports the vertically movable member 12b is spooled) to feed out and spool the elongate flexible members 12a. More specifically, the vertically moving mechanism 12c vertically moves the vertically movable member 12b between a first height which is a height when the transport vehicle 10 travels (i.e., a height at which the vertically movable member 12b is located within the cover of the main body portion 12 in the present embodiment) and a second height which is lower than the first height and is a height at which an article 9 is transferred (loaded and unloaded) between the vertically movable member 12b and a transfer target location for the article 9. In the present embodiment, the vertically movable member 12b has a grip portion configured to grip or hold a flange portion provided in an upper portion of each article 9. And, in the present embodiment, the transport vehicle 10 transfers an article 9 to or from a transfer target location by vertically moving, or raising and lowering, the vertically movable member 12b with the transport vehicle located directly above a transfer target location for the article 9.

As shown in FIG. 1, the travel paths 30 include a first path 31 which extends by way of storage devices 20 and a plurality of second paths 32 each of which is connected to the first path 31 at mutually different locations along the first path 31. The first path 31 is set up, or arranged, to extend by way of article transfer locations of storage devices 20 described above. The article transport facility 1 is provided with a plurality of storage devices 20 (two storage devices 20 in the example shown in FIG. 2) in the present embodiment. And the first path 31 is set up to extend by way of each article transfer location of the plurality of storage devices 20.

Each of the plurality of second paths 32 is set up to extend by way of at least one processing device 2 of a plurality of processing devices 2 each of which is configured to process an article 9 or one or more contents thereof. That is, a plurality of processing devices 2 are provided in the article transport facility 1. Each of the plurality of second paths 32 extends by way of at least one processing device 2 of the plurality of processing devices 2. Each second path 32 is set up to extend by way of load ports 2a (see FIG. 4) of processing devices 2. That is, each second path 32 is set up to pass through a stop position for a transport vehicle 10 for transferring an article 9 to or from the load port 2a of a processing device 2. In the present embodiment, this stop position is set up directly above the corresponding load port 2a, and the second path 32 is set up to pass through a point directly above the load port 2a. In the present embodiment, each of the second path 32 is set up to extend by way of the load ports 2a of a plurality of processing devices 2.

In the present embodiment, each article 9 is a container configured to hold objects that are processed directly by a processing device 2. And each processing device 2 performs one or more processes on the processing target objects held in an article 9. More specifically, each article 9 is a FOUP (Front Opening Unified Pod) configured to hold one or more wafers. And each processing device 2 performs one or more processes (e.g., a cleaning operation and, an etching operation, etc.) on the wafers that had been held in an article 9.

As described in detail below, as shown in FIG. 1, the article transport facility 1 includes transport devices 50 each of which has a connecting portion 51 connected to a storage device 20 and is configured to transport an article 9 to be carried into the storage device 20 or an article 9 being taken out from the storage device 20. Each transport device 50 is located to extend at least from its connecting portion 51 to an area of location of one of the second paths 32. This one of the second paths 32 is hereafter referred to as the "subject path" 33. In the present embodiment, a transport device 50 is provided to each of the two storage devices 20. And a subject path 33 is defined for each of the two transport devices 50.

Here, as shown in FIG. 1, a portion of the first path 31 that passes through branching portions and merging portions between the first path 31 and the second paths 32 will be referred to a first portion 31a whereas a portion of the first path 31 that extends by way of the storage devices 20 (portion that passes through locations directly above the article transfer locations of the storage devices 20) will be referred to as a second portion 31b. The first portion 31a and the second portion 31b form mutually different portions of the first path 31. As shown in FIG. 1, in the present embodiment, in each area between a storage device 20 and the corresponding subject path 33, the first portion 31a and the second portion 31b are so located to be spaced apart from each other in a lateral width direction of the first path 31 in plan view (as seen along a vertical direction Z). The transport vehicles 10 traveling along the first portion 31a travel in the opposite direction from the transport vehicles 10 traveling along the second portion 31b which is space apart from the first portion 31a along the lateral width direction of the first path 31. In the present embodiment, each of the first portion 31a and the second portion 31b is generally formed to form a closed loop (or more specifically, a generally rectangular shape with arc-shaped corners) with the storage devices 20 located within it in plan view. The second portion 31b is located inside (i.e., on the side closer to the storage devices 20) of the first portion 31a.

Furthermore, in the present embodiment, in each area between a storage device 20 and the corresponding subject path 33, a third portion 31c which is a portion of the first path 31 is located between the first portion 31a and the second portion 31b in plan view. That is, the first portion 31a is the closest to the subject path 33, and the third portion 31c, and then the second portion 31b in the order of closeness to the subject path 33, along the lateral width direction of the first path 31 in plan view. Transport vehicles 10 traveling along the second portion 31b travel in the same direction as the transport vehicles 10 traveling along the third portion 31c which is spaced apart from the second portion 31b along the lateral width direction of the first path 31. The third portion 31c is so located that it extends parallel to the second portion 31b and on the outside (i.e., on a side away from the storage devices 20) of the second portion 31b. The third portion 31c is set up not to extend by way of the storage devices 20 to allow other transport vehicle 10 to take over, or pass by, a transport vehicle 10 that has stopped to transfer an article 9 to or from an article transfer location of a storage device 20. The first path 31 further includes connecting paths each of which connects the first portion 31a and the third portion 31c to each other, and connecting paths each of which connects the second portion 31b and the third portion 31c to each other, so that the first portion 31a, the second portion 31b, and the third portion 31c are connected to each other directly or through another portion of the first path 31.

As shown in FIG. 1, in the present embodiment, each subject path 33 includes a closed-loop path 40, a branching path 43, and a merging path 44. In the present embodiment, each of other second paths 32 that are not the subject paths 33 also includes a closed-loop path 40, a branching path 43, and a merging path 44. Each closed-loop path 40 is a path that forms a closed loop in plan view. Each branching path 43 is a path that connects the first path 31 and a closed-loop path 40 to each other, and is a path that allows the transport vehicles 10 to travel (i.e., to perform a "branching travel") from the first path 31 to a subject path 33 (closed-loop path 40). Each merging path 44 is a path that connects the first path 31 and a closed-loop path 40 to each other, and is a path that allows the transport vehicles 10 to travel (i.e., to perform a "merging travel") from a subject path 33 (closed-loop path 40) to the first path 31.

Here, there are two sections in each closed-loop path 40 each of which connects the branching path 43 and the merging path 44 to each other. And one of the two sections will be referred to as a first section 41 whereas the other will be referred to as a second section 42. As shown in FIG. 1, only the first section 41 (between the first section 41 and the second section 42) is arranged to extend by way of at least one processing device 2 (a plurality of processing devices 2 in the present embodiment) among the plurality of processing devices 2.

Figure 5:
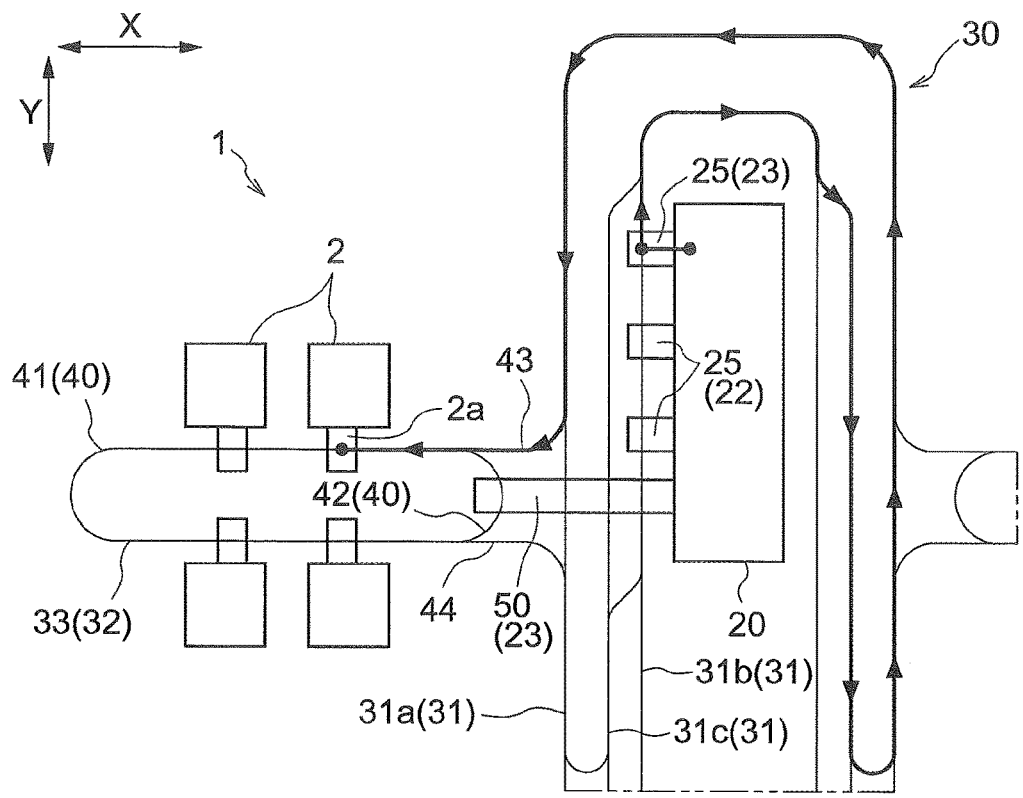
FIG. 5 shows an example of a transporting path of an article when the article is transported from a storage device to a processing device without using the transport device.

Incidentally, as illustrated by an example shown in FIG. 5, when transporting an article 9 between a storage device 20 and a processing device 2 only with a transport vehicle 10, the transporting path of the article 9 between the storage device 20 and the processing device 2 tends to be longer than the distance along a straight line between the storage device 20 and the processing device 2, which tends to increase the amount of time required to transport the article 9 between the storage device 20 and the processing device 2. Note that, in FIG. 5, an example of the trajectory of a transported article 9 when the article 9 is transported from a storage device 20 to a processing device 2 by a transport vehicle 10 is indicated by a bold solid line.

In addition, when an article 9 is transported from a storage device 20 to a processing device 2, the transport vehicle 10 must travel along the first path 31 from an article transfer location (carrying-out portion 23) of the storage device 20 and must subsequently perform a merging travel into a closed-loop path 40 through a branching path 43. Similarly, when an article 9 is transported from a processing device 2 to a storage device 20, the transport vehicle 10 must travel along a closed-loop path 40 from the load port 2a of the processing device 2 and must subsequently perform a merging travel into the first path 31 (the first portion 31a in the present embodiment) through a merging path 44. Thus, when performing a merging travel into another path or into another portion of the same path, etc., smooth traveling of a transport vehicle 10 that is transporting an article 9 between a storage device 20 and a processing device 2 may be interrupted by a presence of another transport vehicle 10, which may be another factor that may increase the amount of time required to transport an article 9 between a storage device 20 and a processing device 2. In addition, since it is necessary for any transport vehicle 10 that is transporting an article 9 between a storage device 20 and a processing device 2 to travel through a plurality of travel paths and/or a plurality of travel path portions in order, the presence of such a transport vehicle 10 tends to increase the number of transport vehicles 10 whose smooth traveling is interrupted directly or indirectly by such a transport vehicle 10. And the article transport efficiency of the entire article transport facility 1 may be reduced by the corresponding amount.

Figure 3:
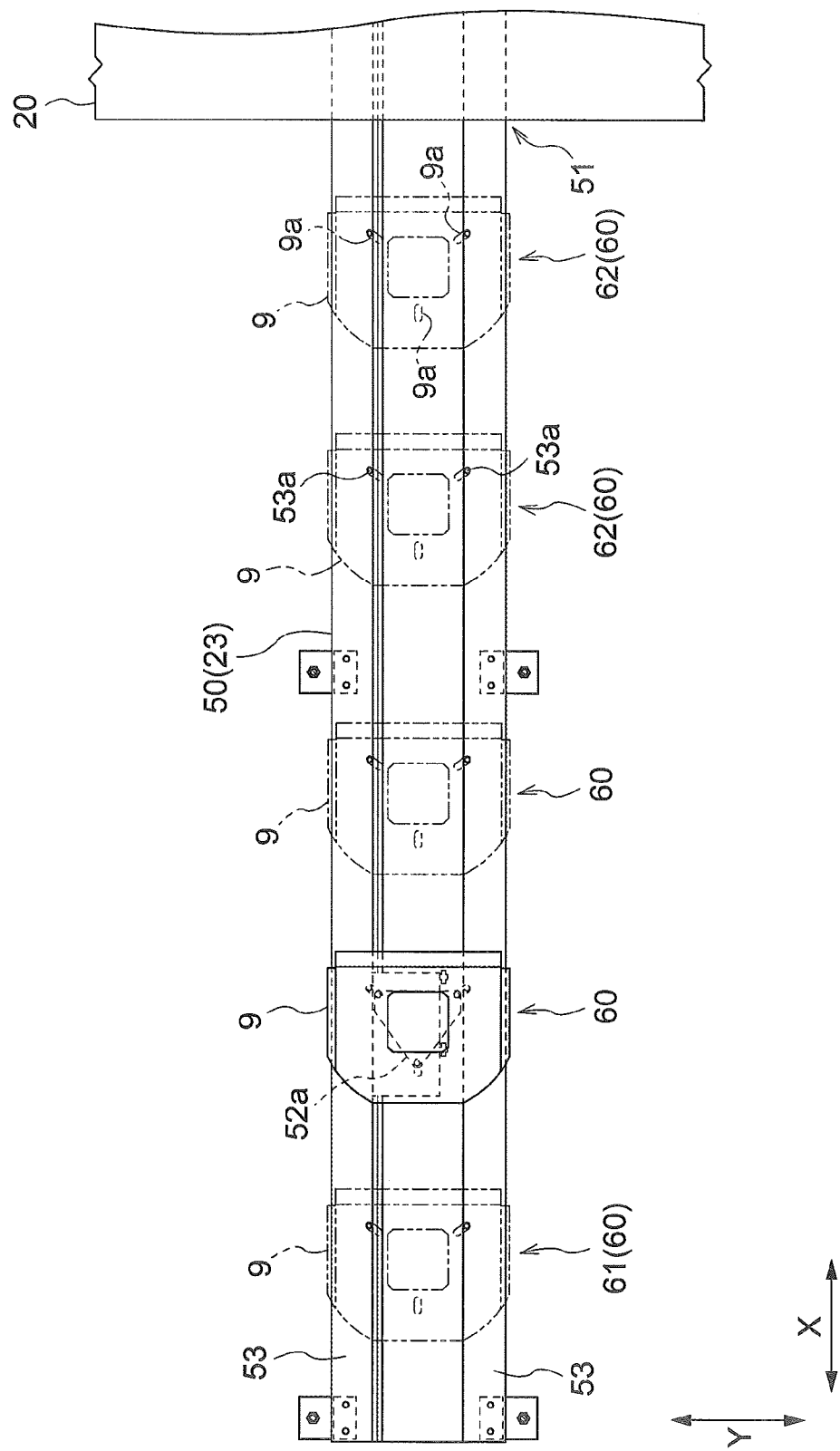
FIG. 3 is a plan view of the transport device in accordance with the embodiment.
Figure 6:
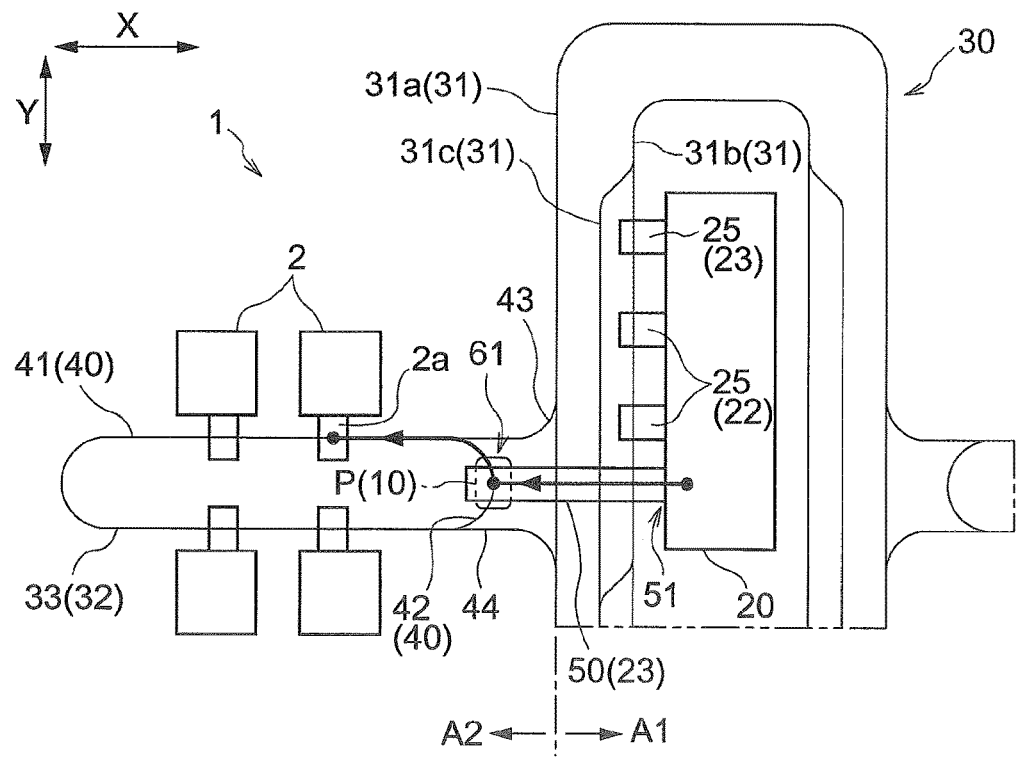
FIG. 6 shows an example of a transporting path of an article when the article is transported from the storage device to the processing device using the transport device.

In light of this issue, as shown in FIGS. 1-3, the article transport facility 1 in accordance with the present embodiment includes transport devices 50 each of which is configured to transport articles 9 to be carried into a storage device 20 and/or the articles 9 being carried out from the storage device 20. As shown in FIGS. 2 and 3, each transport device 50 has a connecting portion 51 connected to a storage device 20. And, as shown in FIG. 6, each transport device 50 is so located that it extends at least from its connecting portion 51 to an area of location of the subject path 33. As illustrated by an example shown in FIG. 6, by providing such a transport device 50, the transporting of an article 9 by a transport vehicle 10 can be limited to the transporting within a subject path 33 when transporting the article 9 between a storage device 20 and a processing device 2 by way of which the subject path 33 extends (which will be referred hereinafter simply as a "processing device 2"). Note that, in FIG. 6, an example of the trajectory of an article 9 when transporting the article 9 from a storage device 20 to a processing device 2 with a transport device 50 and a transport vehicle 10 traveling along the subject path 33 is shown with a bold solid line.

As clearly shown by a comparison between FIG. 5 and FIG. 6, when transporting an article 9 from a storage device 20 to a processing device 2 with a transport device 50 and a transport vehicle 10 traveling along the subject path 33, it is possible to reduce and keep short the transporting distance of the article 9 between the storage device 20 and the processing device 2, and to ensure smooth traveling of the transport vehicle 10 that transports the article 9. As a result, the amount of time required to transport an article 9 between a storage device 20 and a processing device 2 can be reduced. In addition, since the transporting of an article 9 by a transport vehicle 10 when transporting the article 9 between a storage device 20 and a processing device 2 is limited to transporting within a subject path 33, the number of other transport vehicles 10 whose smooth traveling is interrupted by the presence of such a transport vehicle 10 can be reduced, which can help reduce any reduction in the article transporting efficiency of the entire article transport facility 1.

The arrangement of each transport device 50 is described in more detail next. As shown in FIG. 6, one side (with respect to the first path 31) along the lateral width direction of the first path 31 will be referred to as a first side A1 and the other side (with respect to the first path 31) along the lateral width direction will be referred to as a second side A2. Then the connecting portion 51 is located on the first side A1 with respect to the first path 31 whereas the subject path 33 is located on the second side A2 with respect to the first path 31. In the present embodiment, the entire storage device 20 (and the entire storage space) is located on the first side A1 with respect to the first path 31. Note that, when there is a plurality of first paths 31 (more specifically, the first portion 31a, the second portion 31b, and the third portion 31c which are mutually different portions of the first path 31) located between the storage device 20 and the subject path 33 as with the article transport facility 1 in accordance with the present embodiment, the first side A1 and the second side A2 described above may be defined with respect to, for example, the first path 31 that is closest to the subject path 33 (i.e., the first portion 31a in the example shown in FIG. 6). And the transporting path of an article 9 by the transport device 50 crosses the first path 31 in plan view and is arranged to extend from the connecting portion 51 to the second side A2 with respect to the first path 31. In the present embodiment, the transporting path of an article 9 by the transport device 50 extends perpendicular to the first path 31 in plan view. As shown in FIG. 2, the transporting path of an article 9 by the transport device 50 is located below the first path 31 along the vertical direction Z.

And as shown in FIGS. 2, 3, and 6, a first transfer portion 61 to or from which an article 9 is transferred by a transport vehicle 10 that travels along the subject path 33 is set in a portion (of the transporting path of the article 9 by the transport device 50) that is located on the second side A2 with respect to the first path 31. In the present embodiment, a stop position P for the transport vehicle 10 to transfer an article 9 to or from the first transfer portion 61 is set directly above the first transfer portion 61. Therefore, a transport vehicle 10 transfers an article 9 to or from the first transfer portion 61 by vertically moving the vertically movable member 12b with the transport vehicle 10 at rest directly above the first transfer portion 61 (see FIG. 2).

In the present embodiment, as shown in FIG. 3, the direction of a transporting path of the article 9 by the transport device 50 coincides, in plan view, with a direction (referred to as an "extending direction") along which the transport device 50 extends. In the present embodiment, each transport device 50 extends in a straight line, or linearly, at least from a connecting portion 51 to a first transfer portion 61 in plan view so that the transporting path of an article 9 by the transport device 50 is also formed in a straight line in plan view. In addition, in the present embodiment, as shown in FIG. 2, the transport device 50 is formed to extend parallel to a direction extending along a horizontal plane (referred to, hereinafter, as a "first horizontal direction X"). Thus, the transporting path of an article 9 by the transport device 50 is so formed to extend parallel to the first horizontal direction X. In the present embodiment, as shown in FIG. 6, the first horizontal direction X is perpendicular, in plan view, to the extending direction of the first path 31 located between the storage device 20 and the subject path 33. In the following description, a horizontal direction that is perpendicular to the first horizontal direction X will be referred to as a second horizontal direction Y. In the present embodiment, as shown in FIG. 6, each connecting portion 51 is located between a branching path 43 and a merging path 44 along the second horizontal direction Y. In the present embodiment, as shown in FIG. 2, each transport device 50 is suspended from and supported by a ceiling to be fixed to the ceiling. In addition, in the present embodiment, each transport device 50 is located at the same height as the relay transport devices 25. As shown in FIG. 2, the height of each transport device 50 is set such that an entire article 9 transported by the transport device 50 is located at a lower height, along the vertical direction Z, than the entirety of a transport vehicle 10 with its vertically movable member 12b located at the first height described above.

In the present embodiment, each transport device 50 is arranged to extend through a wall of a storage device 20 (see FIGS. 2 and 3) as with each relay transport device 25. And each transport device 50 transports articles 9 between an internal transfer location located inside the storage device 20 and the first transfer portion 61. When using a transport device 50 as a carrying-in portion 22, the transport device 50 transports an article 9 to be carried into the storage device 20 from the first transfer portion 61 to the connecting portion 51 and continues to transport the article 9 from the connecting portion 51 to the internal transfer location. For this to happen, the article 9 is delivered to the first transfer portion 61 by a transport vehicle 10 that travels along the subject path 33. And the article 9 that has been transported to the internal transfer location is transported by the internal transport device 24 from the internal transfer location to a storage section. In addition, when a transport device 50 is used as a carrying-out portion 23, the transport device 50 transports an article 9 being carried out of the storage device 20 from an internal transfer location to the connecting portion 51 and continues to transport the article 9 from the connecting portion 51 to the first transfer portion 61. For this to happen, the article 9 stored in a storage section is delivered to the internal transfer location by the internal transport device 24. And the article 9 that has been transported to the first transfer portion 61 is unloaded, or picked up from, the first transfer portion 61 by a transport vehicle 10 that travels along the subject path 33.

In the present embodiment, each transport device 50 is used as a carrying-out portion 23 in order to supply an article 9 stored in a storage device 20 to a processing device 2 when there is a carry-in request for an article 9 from the processing device 2. That is, each transport device 50 is controlled by a third control device 93 (see FIG. 7) described below in order to transport an article 9 being carried out from a storage device 20 through the connecting portion 51 to the first transfer portion 61.

As shown in FIG. 6, in the present embodiment, the stop position P for a transport vehicle 10 for transferring an article 9 to or from a first transfer portion 61 is set within the second section 42. More specifically, the stop position P is located in a portion of the second section 42 that is closest to the first path 31 (i.e., a portion closest to the first portion 31a in the present embodiment). Thus, by so setting the stop position P within the second section 42, the stop position P can be set and located at a position where traveling of any transport vehicles 10 that enter the first section 41 through the branching path 43, or of any transport vehicles 10 that leave the first section 41 through the merging path 44 would not be interrupted. As a result, articles can be transferred between a transport device 50 and a transport vehicle 10 traveling along a subject path 33 while reducing any reduction in the article transport efficiency of the entire article transport facility 1.

In the present embodiment, as shown in FIGS. 2 and 3, each transport device 50 includes a carriage 52 which can travel back and forth along the transporting path of an article 9 by the transport device 50. The carriage 52 has a support body 52a which can support an article 9 from below and which can be moved vertically. And formed on the top surface of the support body 52a are projections (positioning pins) which are configured to engage three positioning recessed portions 9a (see FIG. 3) formed in the bottom surface of each article 9 to properly position the article 9. In addition, each transport device 50 includes a pair of support members 53 each of which extends along the first horizontal direction X with one support member 53 located on one side and the other support member 53 located on the other side, along the second horizontal direction Y, with respect to the support body 52a. The pair of support members 53 are formed to extend along the first horizontal direction X over the entire length of the transporting path of an article 9 by the transport device 50. And formed on the top surface of each support member 53 of the pair are projections 53a (positioning pins) each of which is located to engage one of the aforementioned three recessed portions 9a formed in the bottom surface of each article 9.

The support body 52a is supported by the carriage 52 such that it can be raised and lowered, or vertically moved, between a lowered height at which upper ends of projections provided to the support body 52a is at a lower height than the top surfaces of the pair of support members 53 and a raised height at which the top surface of the support body 52a is at a higher height than the upper ends of the projections 53a formed in the pair of support members 53. Therefore, by moving the carriage 52 with the support body 52a (that is supporting an article 9) maintained at the raised height, the article 9 is transported in the same direction as the moving direction of the carriage 52. And, the pair of support members 53 can be caused to support the article 9 by lowering the support body 52a supporting the article 9 from the raised height to the lowered height at a location at which the projections 53a are formed. When this happens, the article 9 comes to be supported by the pair of support members 53 with the article properly positioned with respect to the pair of support members 53 by the engaging of the projections 53a with the recessed portions 9a.

As shown in FIG. 3, the projections 53a are formed at least at a location in the pair of support members 53 that corresponds to the first transfer portion 61. In the present embodiment, the projections 53a are also formed at a plurality of locations in the pair of support members 53 between the first transfer portion 61 and the connecting portion 51. That is, a plurality of projections 53a are formed on, or otherwise provided to, the pair of support members 53 such that the projections 53 are spaced apart from each other along the first horizontal direction X. And an article support portion 60 on which an article can be temporarily stored is formed at a position that corresponds to each pair of projections 53a. This arrangement makes it possible for the transport device 50 to be used also as a temporary storage (or a buffer as it is commonly referred to).

In the present embodiment, the article support portion 60 of the plurality of article support portions 60 that is farthest from the connecting portion 51 is used as the first transfer portion 61. In addition, in the present embodiment, the plurality of article support portions 60 include second transfer portions 62 to or from which articles 9 are transferred by transport vehicles 10 traveling along the first path 31. That is, in the present embodiment, the second transfer portions 62 to or from which articles 9 are transferred by transport vehicles 10 traveling along the first path 31 are formed along the transporting path of an article 9 by the transport device 50 in addition to the first transfer portion 61. In the present embodiment, a stop position for a transport vehicle 10 to transfer an article 9 to or from the corresponding second transfer portion 62 is set directly above the second transfer portion 62. Therefore, a transport vehicle 10 transfers an article 9 to or from a second transfer portion 62 by vertically moving the vertically movable member 12b while the transport vehicle 10 is located directly above the second transfer portion 62. In the example shown in FIGS. 2 and 3, two second transfer portions 62 are formed, namely, a second transfer portion 62 to or from which an article 9 is transferred by a transport vehicle 10 traveling along the second portion 31b, and a second transfer portion 62 to or from which an article 9 is transferred by a transport vehicle 10 traveling along the third portion 31c.

By forming the second transfer portions 62 along the transporting path of an article 9 by the transport device 50 in addition to the first transfer portion 61 as described above, an article 9 can be transferred between a transport vehicle 10 traveling along the first path 31 and a transport vehicle 10 traveling along a subject path 33, through a transport device 50. Therefore, it is possible to transfer an article 9 between a transport vehicle 10 traveling along the first path 31 and a processing device 2 by means of a transport device 50 and a transport vehicle 10 traveling along the subject path 33 without having to cause the transport vehicle 10 traveling along the first path 31 to enter a subject path 33 in response to a transport command that specifies the processing device 2 as a transport origin, or a transport destination for the article 9.

As shown in FIG. 7, the article transport facility 1 in accordance with the present embodiment includes a first controller 91 that controls transporting of articles 9 in the entire facility, second controllers 92 each of which controls, in accordance with a command from the first controller 91, the operations of storage transport devices 21 which transports articles 9 in a storage device 20, and third controllers 93 each of which controls the operation of a transport device 50. In addition, the article transport facility 1 includes fourth controllers 94 each of which controls the operation of a transport vehicle 10 in accordance with a command from the first controller 91. The first controller 91 is connected to each of the second controllers 92 and the fourth controllers 94 for mutual communication. In the present embodiment, the first controller 91 is also connected to the third controllers 93 for mutual communication.

Upon receiving a command from the first controller 91 for transporting an article 9 currently stored in a storage device 20 by means of a transport device 50 to a processing device 2, a second controller 92 controls operation of the internal transport device 24 to cause it to transport the article 9 (to be transported) from a storage section in which the article 9 to be transported is stored to the internal transfer location of a transport device 50. And the second controller 92 outputs, to the corresponding third controller 93, a command for transporting the article 9 that has been transported to the internal transfer location to the first transfer portion 61. The third controller 93 controls the operation of the transport device 50 (a traveling operation of the carriage 52 and a vertical movement operation of the support body 52a in the present embodiment) in accordance with the command from the second controller 92 to cause the article 9 to be transported from the internal transfer location to the first transfer portion 61. Note that, when a plurality of articles 9 are present on the transport device 50, the plurality of articles 9 are placed to be supported by a plurality of article support portions 60 such that the articles 9 are located as close to the first transfer portion 61 as possible with no empty article support portion between any two supported articles 9. In addition, a fourth controller 94 controls, in accordance with a command from the first controller 91, the operation of a transport vehicle 10 (i.e., a traveling operation of the travel portion 11, a vertical movement operation of the vertically movable member 12b, a switching operation of the grip portion provided to the vertically movable member 12b, in the present embodiment) to cause the article 9 to be transported from the first transfer portion 61 to the load port 2a of a processing device 2.

As described above, a third controller 93 is configured to be capable of controlling the operation of the transport device 50 in a first control mode which is a control mode for controlling, in accordance with a command from a second controller 92, the operation of the transport device 50 to transport an article 9 to be carried into, or being carried out from, a storage device 20 (an article 9 being carried out from a storage device 20 in the present embodiment). In addition to the first control mode, each third controller 93 in accordance with the present embodiment is configured to be capable of controlling the operation of the transport device 50 in a second control mode. That is, each third controller 93 can control the operation of the transport device 50 in both the first control mode and the second control mode.

The second control mode is a control mode for controlling, in accordance with a command from the first controller 91, the operation of a transport device 50 to transport an article 9 between the first transfer portion 61 and a second transfer portion 62. Each third controller 93 controls the operation of the corresponding transport device 50 in the second control mode, for example, when an abnormal condition occurs in the second controller 92, or when an abnormal condition occurs in the storage device 20 (abnormal condition of the storage transport device 21, etc.). If that happens, the third controller 93 receives a command for transporting the article 9 between the first transfer portion 61 and a second transfer portion 62 directly from the first controller 91 (see the communication path shown with a dashed line in FIG. 7) without the involvement of the second controller 92. To describe an example in which an article 9 is delivered from a transport vehicle 10 traveling along the first path 31 to a transport vehicle 10 traveling along a subject path 33, a fourth controller 94 controls, in accordance with a command from the first controller 91, the operation of the transport vehicle 10 supporting the article 9 to deliver the article 9 to a second transfer portion 62. Subsequently, a third controller 93 controls the operation of the transport device 50 in accordance with a command from the first controller 91 to transport the article 9 from the second transfer portion 62 to the first transfer portion 61. Note that, when a plurality of articles 9 are present on the transport device 50, the plurality of articles 9 are placed to be supported by a plurality of article support portions 60 such that the articles 9 are located as close to the first transfer portion 61 as possible with no empty article support portion between any two supported articles 9. And a fourth controller 94 controls the operation of the transport vehicle 10 in accordance with a command from the first controller 91 to transport the article 9 from the first transfer portion 61 to the load port 2a of a processing device 2.

There are following advantages when arranging the third controller 93 to be capable of controlling the operation of the transport device 50 in the second control mode as described above. Specifically, even in an event that an article 9 cannot be carried into, or carried out from, a storage device 20 due to an abnormal condition in the second controller 92, or an abnormal condition in the storage device 20, it becomes possible to transfer an article 9 between a transport vehicle 10 traveling along the first path 31 and a processing device 2 by means of a transport device 50 and a transport vehicle 10 traveling along a subject path 33 without having to cause the transport vehicle 10 traveling along the first path 31 to enter the subject path 33, by changing or switching the control mode of the transport device 50 from the first control mode to the second control mode. In addition, the articles 9 that are present on a plurality of article support portions 60 can be transported to another normally-functioning storage device 20 or a processing device 2 by means of transport vehicles 10 through the first transfer portion 61 or a second transfer portion 62.

[Other Embodiments]

Other embodiments of an article transport facility are described next. Note that any arrangement and feature disclosed in each of the following embodiments can also be used in combination with any arrangement and feature disclosed in any other embodiment unless inconsistency arises.

(1) In the embodiment described above, an example is described in which each transport device 50 extends in a straight line, or linearly, from a connecting portion 51 to a first transfer portion 61 in plan view so that the transporting path of an article 9 by the transport device 50 is also formed in a straight line in plan view. However, the invention is not limited to such an arrangement. For example, as in an example shown in FIG. 8, the extending direction of the transport device 50 may change so that the transport device 50 has a bend in plan view so that the transporting path of an article 9 by the transport device 50 is also formed in a shape that has a bend in plan view. In the example shown in FIG. 8, the transport device 50 itself or the transporting path of an article 9 by the transport device 50 extends from the connecting portion 51 along the second horizontal direction Y (direction parallel to the extending direction of the first path 31 located between the storage device 20 and the subject path 33) and then is bent by 90 degrees in plan view to extend parallel to the first horizontal direction X over to the second side A2 with respect to the first path 31.

Figure 8:
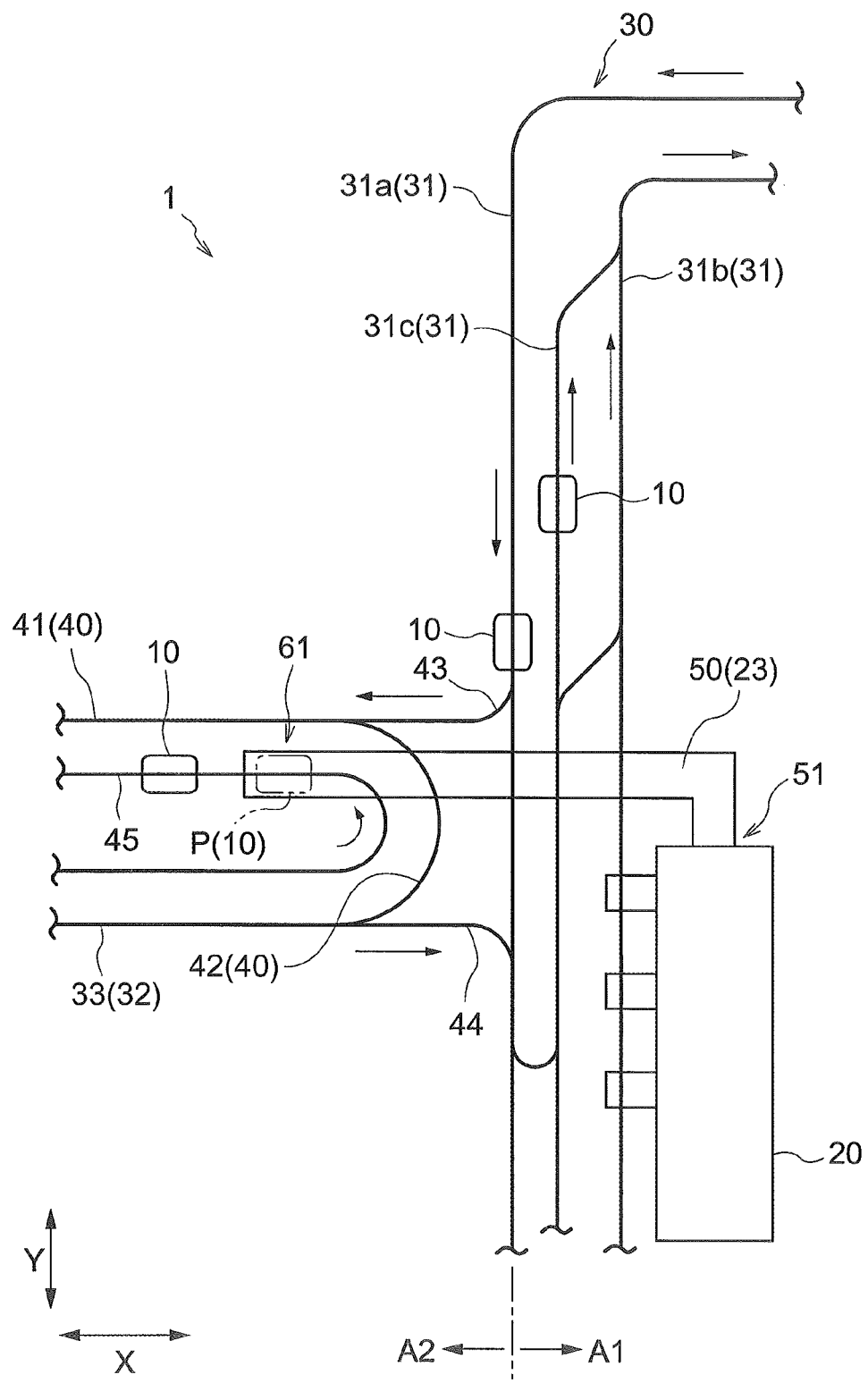
FIG. 8 is a plan view of an article transport facility in accordance with another embodiment.

(2) In the embodiment described above, an example is described in which a stop position P for a transport vehicle 10 for transferring an article 9 to or from a first transfer portion 61 is set within the second section 42. However, the invention is not limited to such an arrangement. A stop position P may be set at a position outside the second section 42 of a subject path 33. The stop position P shown in FIG. 8 is an example of such an arrangement. The subject path 33 includes a closed-loop path 40 and another closed-loop path (second closed-loop path 45) located within the closed-loop path 40 in the example shown in FIG. 8. While not shown, the subject path 33 includes one or more connecting paths for connecting the closed-loop path 40 and the second closed-loop path 45 to each other. And, in the example shown in FIG. 8, the stop position P is set in the second closed-loop path 45.

Note that, in the embodiment described above, the second section 42 is formed only by a curved section, and the stop position P is set within the curved section (see FIG. 6) but that, if and when the second section 42 is formed with a straight section and a curved section on each side of the straight section, the stop position P may be set in the straight section of the second section 42. For example, if the system for supplying electric power to a transport vehicle 10 is a system that electric power supplying efficiency (electric power receiving efficiency of the transport vehicle 10) is lower in a curve section than in a straight section. Thus, there is an advantage that setting the stop position P in a straight section makes it easier to properly secure electric power for the transport vehicle 10 for when transferring an article 9 to or from the first transfer portion 61.

(3) In the embodiment described above, an example is described in which a plurality of second transfer portions 62 are set along the transporting path of an article 9 by the transport device 50, in addition to the first transfer portion 61. However, the invention is not limited to such an arrangement. For example, only one second transfer portion 62 may set along the transporting path of an article 9 by the transport device 50, or no second transfer portions 62 may be set along the transporting path of an article 9 by the transport device 50.

(4) In the embodiment described above, an example is described in which each transport device 50 is used as a carrying-out portion 23, and in which each transport device 50 is controlled to transport an article 9 being carried out from a storage device 20 from a connecting portion 51 to a first transfer portion 61. However, the invention is not limited to such an arrangement. Instead, a transport device 50 may be used as a carrying-in portion 22. And the transport device 50 may be controlled to transport an article 9 to be carried into a storage device 20 from a first transfer portion 61 to a connecting portion 51. In addition, arrangement may be made such that the role of each transport device 50 as a carrying-in portion 22 or a carrying-out portion 23 may be switched depending on the status of the article transport facility 1 at any given time.

(5) In the embodiment described above, an example is described in which each transport device 50 includes a carriage 52 for transporting articles 9, one article 9 at a time. However, the invention is not limited to such an arrangement. A roller conveyor with a plurality of driven rollers one next to another along the transporting path, or a belt conveyer having a transporting belt that moves along the transporting path may be used as a transport device 50.

(6) In the embodiment described above, an example is described in which a transport vehicle 10 transfers an article 9 to or from a transfer target location by vertically moving the vertically movable member 12b while the transport vehicle 10 is located directly above the transfer target location. However, the invention is not limited to such an arrangement. Instead, a transport vehicle 10 may include a sliding mechanism configured to slide, or smoothly move, the vertically moving mechanism 12c along the lateral width direction of a travel path 30 so that, even if the location of a transfer target location is displaced along the lateral width direction of the travel path 30 with respect to the transport vehicle 10, an article 9 can be transferred to or from the transfer target location by vertically moving the vertically movable member 12b after the vertically moving mechanism 12c has been moved along the lateral width direction until it is located directly above the transfer target location. In such a case, unlike the embodiment described above, a travel path 30 may be arranged to pass through a position that is displaced along the lateral width direction of the travel path 30 with respect to the transfer target location for an article 9 and for a transport vehicle 10.

For example, a stop position for a transport vehicle 10 for transferring an article 9 to a storage device 20 (article transfer location of the storage device 20) may be at a position that is displaced along the lateral width direction of the first path 31 with respect to the article transfer location. In other words, the first path 31 may be arranged to pass through a position that is displaced along the lateral width direction of the first path 31 with respect to the article transfer location of the storage device 20. In this case, the article transfer location of the storage device 20 may be located within the storage device 20. In this case, unlike the embodiment described above, a storage device 20 may not include a relay transport device 25 as a storage transport device 21, and may only have an internal transport device 24.

In addition, for example, a stop position P for a transport vehicle 10 for transferring an article 9 to or from a first transfer portion 61 may be located on the opposite side of the first transfer portion 61 from the first path 31 along the first horizontal direction X (on the opposite side from the connecting portion 51) in plan view. In other words, the end portion on the second side A2 of the transport device 50 (the end portion on the second side A2 of the transporting path of an article 9 by the transport device 50) may be located closer to the first path 31 along the first horizontal direction X than the stop position P (i.e., the end portion does not reach the stop position P) in plan view.

(7) In the embodiment described above, an example is described in which each transport vehicle 10 is a ceiling or overhead transport vehicle configured to travel along the rails 3 provided on the ceiling side. However, the invention is not limited to such an arrangement. For example, a transport vehicle may be a floor traveling type configured to travel along one or more rails provided on a floor surface. In such a case, unlike the embodiment described above, a transporting path of an article 9 by each transport device 50 is located above the first path 31 along the vertical direction Z.

(8) In the embodiment described above, an example is described in which each article 9 is a FOUP for holding one or more semiconductor substrates. However, the invention is not limited to such an arrangement. An article may be, among other possibilities, a container for holding one or more reticles or may be a container for holding food. In addition, an articles 9 may be an object different from a container.

(9) With regard to any other arrangement, the embodiments disclosed in the present specification should be understood to be provided for the sole purpose of illustrating examples in all aspects. Accordingly, a person skilled in the art will be able to make various changes and modifications to the disclosed arrangements without departing from the spirit of the present disclosure.

[Summary of Embodiments Described Above]

A brief summary of the article transport facility described above is provided next.

An article transport facility comprises: article transport vehicles each of which is capable of traveling along any of travel paths to transport an article; and a storage device configured to store one or more articles wherein the travel paths include a first path that extends by way of the storage device, and a plurality of second paths connected to the first path at mutually different locations along the first path; wherein each of the plurality of second paths is arranged to extend by way of at least one processing device configured to process an article or one or more contents thereof, wherein the article transport facility includes a transport device which has a connecting portion connected to the storage device, and which is configured to transport an article to be carried into, or being carried out from, the storage device, wherein, with a first side being one side, with respect to the first path, along a lateral width direction of the first path and a second side being the other side, with respect to the first path, along a lateral width direction of the first path, the connecting portion is located on the first side with respect to the first path whereas a subject path which is one of the plurality of second paths is located on the second side with respect to the first path, wherein a transporting path of an article by the transport device is so located to cross the first path in plan view and to extend at least from the connecting portion and to the second side with respect to the first path, and wherein a first transfer portion to or from which an article is transferred by a transport vehicle traveling along the subject path is set in a portion of the transporting path that is located on the second side with respect to the first path.

With the arrangement described above, when transporting an article between a storage device and a processing device by way of which a subject path extends (referred to hereinafter in this section simply as a "processing device"), the article can be transported by a transport device from at least the connecting portion connected to the storage device and the first transfer portion or vice versa; thus, transporting of the article by a transport vehicle can be limited to transporting within the subject path. Therefore, it becomes possible to reduce the transporting distance of an article between a storage device and a processing device can be reduced and to ensure smooth traveling of the transport vehicle that transports the article. As a result, the amount of time required to transport an article between a storage device and a processing device can be reduced. In addition, since the transporting of an article by the transport vehicle for transporting the article between a storage device and a processing device is limited to transporting within a subject path, the number of other transport vehicles whose smooth traveling is interrupted by the presence of such a transport vehicle may be reduced, which in turn reduces any reduction in the article transporting efficiency of the entire facility.

As such, with the arrangement described above, an article transport facility can be provided in which any reduction in the article transporting efficiency of the entire facility is reduced while reducing the amount of time required to transport an article between a storage device and a processing device.

Here, the transport device preferably transports an article being carried out from the storage device at least from the connecting portion to the first transfer portion.

With the arrangement described above, when transporting an article currently stored in the storage device to a processing device, the article can be quickly transported to the processing device by means of the transport device and the transport vehicle traveling along the subject path. Therefore, the processing efficiency of the processing device in processing an article or its content(s) can be improved.

In addition, the subject path preferably includes a closed-loop path which is formed in a loop in plan view, a branching path which is a path which connects the first path and the closed-loop path to each other, and which allows a transport vehicle to perform a branching travel from the first path to the subject path, and a merging path which is a path which connects the first path and the closed-loop path to each other, and which allows a transport vehicle to perform a merging travel from the subject path to the first path, wherein, with a first section being one of two sections of the closed-loop path each of which connects the branching path and the merging path to each other and a second section being the other of the two sections, only the first section of the two sections is preferably so located to extend by way of the at least one processing device, and wherein a stop position for a transport vehicle for transferring an article to or from the first transfer portion is preferably set within the second section.

With the arrangement in which the subject path is formed as described above, a transport vehicle, for which the processing device by way of which the first section extends is the transport origin or the transport destination for an article, may enter the first section through the branching path, or may exit the first section through the merging path. With respect to this point, with the arrangement described above, the stop position for the transport vehicle for transferring the article to or from the first transfer portion can be set at a position within the second section where traveling of another transport vehicle that enters the first section through the branching path or that exits the first section through the merging path would not be interrupted. As a result an article can be transferred between a transport device and a transport vehicle traveling along the subject path while reducing any reduction in the article transporting efficiency of the entire facility.

In addition, a second transfer portion to or from which an article is transferred by a transport vehicle traveling along the first path is preferably set along the transporting path, in addition to the first transfer portion.

With the arrangement described above, an article can be transferred, through the transport device, between a transport vehicle traveling along the first path, and a transport vehicle traveling along the subject path. Therefore, it is possible to transfer an article between a transport vehicle traveling along the first path and a processing device by means of the transport device and a transport vehicle traveling along the subject path without having to cause the transport vehicle traveling along the first path to enter a subject path in response to a transport command that specifies the processing device as a transport origin, or a transport destination for the article. As a result, it becomes possible to transfer an article between a transport vehicle traveling along the first path and a processing device while reducing any traffic congestion of the transport vehicles in the subject path.

When the second transfer portion is set in the transporting path in addition to the first transfer portion, the article transport facility preferably further comprises a first controller that controls transporting of articles for the entire article transport facility, a second controller that controls, in accordance with a command from the first controller, operation of one or more storage transport devices which transport articles in the storage device, and a third controller that controls operation of the transport device, wherein the third controller is configured to control operation of the transport device in a first control mode and a second control mode, wherein the first control mode is preferably a control mode for controlling operation of the transport device to transport an article to be carried into, or an article being carried out of, the storage device, in accordance with a command from the second controller, and wherein the second control mode is preferably a control mode for controlling operation of the transport device to transport an article between the first transfer portion and the second transfer portion, in accordance with a command from the first controller.

With the arrangement described above, even in an event that an article can not be carried into, or carried out from, the storage device due to an abnormal condition in a second controller, or an abnormal condition in a storage device (for example, an abnormal condition in a storage transport device), it becomes possible to transfer an article between a transport vehicle traveling along the first path and a transport vehicle traveling along the second path through the transport device, by changing or switching the control mode for the transport device from the first control mode to the second control mode. Therefore, even in an event described above, it becomes possible to transfer an article between a transport vehicle traveling along the first path and a processing device while reducing any traffic congestion of the transport vehicles in the subject path.

What is claimed is:

1. An article transport facility comprising:
   article transport vehicles each of which is capable of traveling along any of travel paths to transport an article; and
   a storage device configured to store one or more articles;
   wherein the travel paths include a first path that extends by way of the storage device, and a plurality of second paths connected to the first path at mutually different locations along the first path,
   wherein each of the plurality of second paths is arranged to extend by way of at least one processing device configured to process an article or one or more contents thereof;
   wherein the article transport facility includes a transport device which has a connecting portion connected to the storage device, and which is configured to transport an article to be carried into, or being carried out from, the storage device,
   wherein the transport device is provided separately from the article transport vehicles, wherein, with a first side being one side, with respect to the first path, along a lateral width direction of the first path and a second side being the other side, with respect to the first path, along a lateral width direction of the first path, the connecting portion is located on the first side with respect to the first path whereas a subject path which is one of the plurality of second paths is located on the second side with respect to the first path, wherein a transporting path of an article by the transport device is so located to cross the first path in plan view and to extend at least from the connecting portion and to the second side with respect to the first path, and wherein a first transfer portion at which an article is transferred between the transport device and the article transport vehicle traveling along the subject path is set in a portion of the transporting path that is located on the second side with respect to the first path.

2. The article transport facility as defined in claim 1, wherein the transport device transports an article being carried out from the storage device at least from the connecting portion to the first transfer portion.

3. The article transport facility as defined in claim 1, wherein the subject path includes a closed-loop path which is formed in a loop in plan view, a branching path which is a path which connects the first path and the closed-loop path to each other, and which allows the article transport vehicle to perform a branching travel from the first path to the subject path, and a merging path which is a path which connects the first path and the closed-loop path to each other, and which allows the article transport vehicle to perform a merging travel from the subject path to the first path, wherein, with a first section being one of two sections of the closed-loop path each of which connects the branching path and the merging path to each other and a second section being the other of the two sections, only the first section of the two sections is so located to extend by way of the at least one processing device, and wherein a stop position for the article transport vehicle for transferring an article to or from the first transfer portion is set within the second section.

4. The article transport facility as defined in claim 1, wherein a second transfer portion at which an article is transferred between the transport device and the article transport vehicle traveling along the first path is set along the transporting path, in addition to the first transfer portion.

5. The article transport facility as defined in claim 4, further comprising:

a first controller that controls transporting of articles for the entire article transport facility, a second controller that controls, in accordance with a command from the first controller, operation of one or more storage transport devices which transport articles in the storage device, and a third controller that controls operation of the transport device, wherein the third controller is configured to control operation of the transport device in a first control mode and a second control mode, wherein the first control mode is a control mode for controlling operation of the transport device to transport an article to be carried into, or an article being carried out of, the storage device, in accordance with a command from the second controller, and wherein the second control mode is a control mode for controlling operation of the transport device to transport an article between the first transfer portion and the second transfer portion, in accordance with a command from the first controller.

6. The article transport facility as defined in claim 4, wherein the second transfer portion overlaps the first path in plan view of the transporting path.

7. The article transport facility as defined in claim 1, wherein the storage device has, separately from the connecting portion, an article transfer location to or from which an article is transferred by the article transport vehicle.

8. The article transport facility as defined in claim 1, wherein at a point at which the transporting path intersects the first path in plan view, the transporting path and the first path are arranged at different positions in the vertical direction.

* * * * *